US012650447B2

(12) United States Patent
Chang

(10) Patent No.: US 12,650,447 B2
(45) Date of Patent: Jun. 9, 2026

(54) CURRENT SENSING CIRCUIT ADAPTABLE TO MOSFET CIRCUITS

(71) Applicant: Himax Technologies Limited, Tainan City (TW)

(72) Inventor: Yaw-Guang Chang, Tainan City (TW)

(73) Assignee: Himax Technologies Limited, Tainan City (TW)

( * ) Notice: Subject to any disclaimer, the term of this patent is extended or adjusted under 35 U.S.C. 154(b) by 245 days.

(21) Appl. No.: 18/598,964

(22) Filed: Mar. 7, 2024

(65) Prior Publication Data

US 2025/0283922 A1 Sep. 11, 2025

(51) Int. Cl.
*G01R 19/00* (2006.01)
*G01R 19/165* (2006.01)

(52) U.S. Cl.
CPC ..... *G01R 19/0092* (2013.01); *G01R 19/0023* (2013.01); *G01R 19/165* (2013.01)

(58) Field of Classification Search
CPC G01R 19/00; G01R 19/0023; G01R 19/0084; G01R 19/0092; G01R 19/165; G01R 19/16504; G01R 19/16519
USPC ............................................. 324/76.11, 126
See application file for complete search history.

(56) References Cited

U.S. PATENT DOCUMENTS

| | | | | |
|---|---|---|---|---|
| 7,336,085 B2 * | 2/2008 | Fabbro | ................... | H03K 17/18 |
| | | | | 324/691 |
| 11,385,266 B2 * | 7/2022 | Kimura | .............. | H03K 17/0822 |
| 12,206,331 B2 * | 1/2025 | Chen | ..................... | H02M 3/158 |
| 12,510,567 B2 * | 12/2025 | Kimura | .............. | G01R 19/0092 |

FOREIGN PATENT DOCUMENTS

| | | | | | |
|---|---|---|---|---|---|
| CN | 113791266 A | * | 12/2021 | ......... | G01R 19/0092 |
| CN | 219085020 U | * | 5/2023 | ........... | G01R 19/165 |
| JP | 7161432 B2 | * | 10/2022 | ......... | G01R 19/0092 |

* cited by examiner

*Primary Examiner* — Hoai-An D. Nguyen
(74) *Attorney, Agent, or Firm* — Donald E. Stout; Stout, Uxa & Buyan, LLI

(57) ABSTRACT

A current sensing circuit includes an output driving transistor with an output node that provides an output voltage; a diode-connected first transistor connected between the output node and a current circuit; a second transistor and a third transistor connected in series, the second transistor having a gate connected to a gate of the output driving transistor, and the third transistor having a gate connected to a gate of the first transistor; and a current measuring circuit connected in series with the second transistor and the third transistor to measure a current flowing through the second transistor and the third transistor.

17 Claims, 5 Drawing Sheets

100

CURRENT SENSING CIRCUIT ADAPTABLE TO MOSFET CIRCUITS

BACKGROUND OF THE INVENTION

1. Field of the Invention

The present invention generally relates to a current sensing circuit, and more particularly to a current sensing circuit adaptable to metal-oxide-semiconductor field-effect transistor (MOSFET) circuits.

2. Description of Related Art

A current sensing circuit is a device that measures the current flowing through an electrical conductor. It is used to monitor and control the amount of current in a circuit. The current sensing circuit may be adaptable to MOSFET circuits such as MOSFET switches or MOSFET output stages in current overload protection application, DC charge and discharge current protection application and power IC current feedback sensing application.

There are several types of current sensing circuits, for example, shunt resistors and Hall effect sensors. Shunt resistors are the most common type of current sensing circuit. They work by measuring the voltage drop across a resistor in series with the load. The voltage drop is proportional to the current flowing through the resistor, which can be measured using an amplifier circuit.

Hall effect sensors are another type of current sensing circuit used to measure both AC and DC currents. They work by measuring the magnetic field generated by the current flowing through a conductor. The magnetic field causes a change in the output voltage of the sensor, which can be measured using an amplifier circuit.

However, the Hall effect sensor is large in size and easily affected by noise. The shunt-resistors type of current sensing circuit requires a small resistance to convert a current signal into a voltage signal, which nevertheless requires an amplifier circuit and noise filtering. The current detection resolution is disadvantageously low and the voltage drop on the resistor path is required.

A method of implementing a current sensing circuit is by using a booster DC-to-DC converter. This method requires precision resistors connected in series for current feedback control and converting series resistors into voltage measurement, which results in additional power loss.

Another way to implement a current sensing circuit is by using an operational amplifier (OP) feedback current detection circuit. However, this method has limitations in terms of OP operating bandwidth and static current consumption. Additionally, adding OP circuits will increase the overall cost of the circuit.

Due to the reasons mentioned earlier, there is a need to propose a current sensing circuit that is both high-speed and low-latency. This circuit should be suitable for over-current protection, power IC current feedback, or operational amplifier output stage current measurement.

SUMMARY OF THE INVENTION

In view of the foregoing, it is an object of the embodiment of the present invention to provide a current sensing circuit that is both high-speed and low-latency, while also meeting the requirements of high-precision current detection. This is achieved without using a resistor series structure to sense current in a shunt detection circuit, and without using an operational amplification structure to achieve high-speed current detection function.

According to one embodiment, a current sensing circuit includes an output driving transistor, a diode-connected first transistor, a second transistor, a third transistor and a current measuring circuit. The output driving transistor has an output node that provides an output voltage. The diode-connected first transistor is connected between the output node and a current circuit. The second transistor and the third transistor are connected in series, the second transistor having a gate connected to a gate of the output driving transistor, and the third transistor having a gate connected to a gate of the first transistor. The current measuring circuit is connected in series with the second transistor and the third transistor to measure a current flowing through the second transistor and the third transistor.

DETAILED DESCRIPTION OF THE INVENTION

Figure 1A:
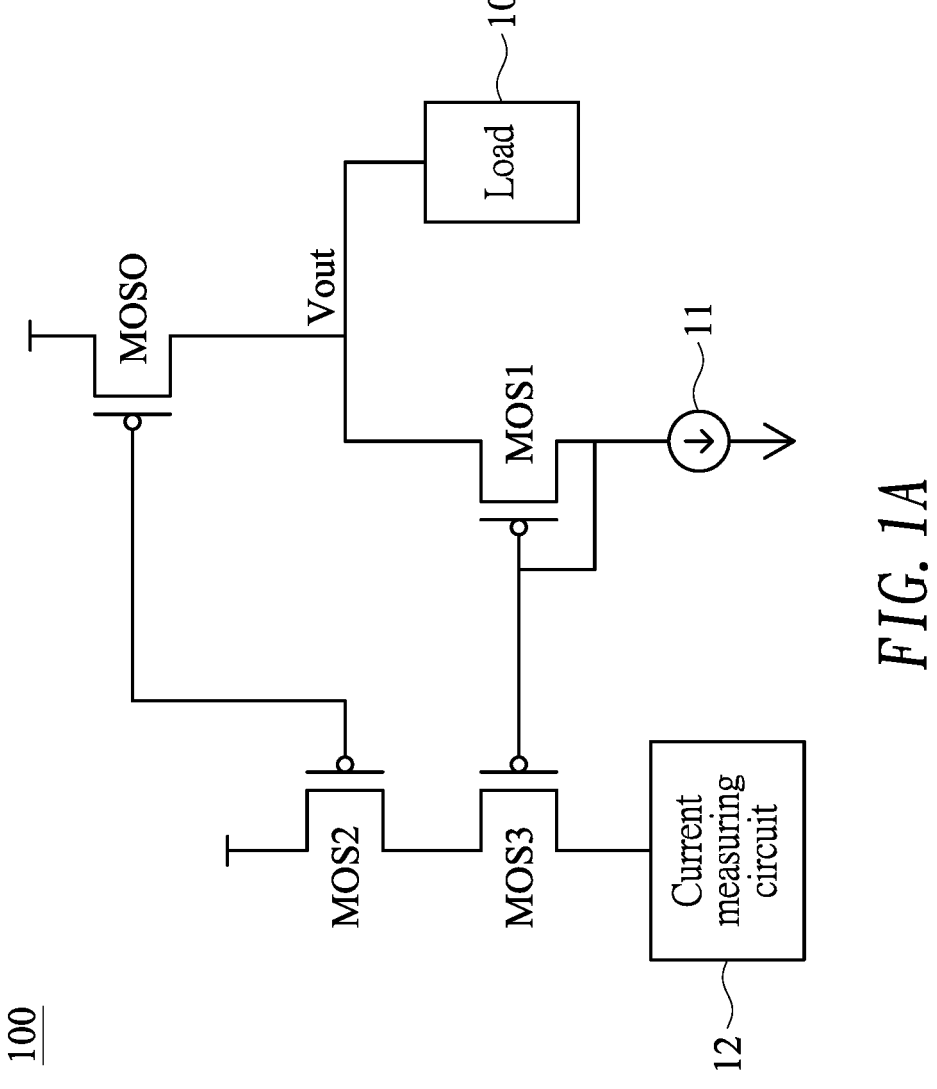
FIG. 1A shows a circuit diagram illustrating a current sensing circuit adaptable to metal-oxide-semiconductor field-effect transistor (MOSFET) circuits according to one embodiment of the present invention.

FIG. 1A shows a circuit diagram illustrating a current sensing circuit 100 adaptable to metal-oxide-semiconductor field-effect transistor (MOSFET) circuits such as, but not limited to, MOSFET switches or MOSFET output stages according to one embodiment of the present invention. The current sensing circuit 100 may, for example, be applied to current overload protection, direct-current (DC) charge and discharge current protection and power integrated circuit (IC) current feedback sensing.

In the embodiment, the current sensing circuit 100 may include an output driving transistor MOSO (of an output stage) connected between a power supply and an output node that provides an output voltage Vout. The current sensing circuit 100 may include a diode-connected (with gate and drain connected) first transistor MOS1 connected between the output node and a current circuit 11 (e.g., current source). The current sensing circuit 100 may include a second transistor MOS2 and a third transistor MOS3 connected in series with a current measuring circuit 12 (configured to measure a current flowing through the second transistor MOS2 and the third transistor MOS3). The second transistor MOS2 has a gate connected to a gate of the output driving transistor MOSO, and the third transistor MOS3 has a gate connected to a gate of the first transistor MOS1. It is noted that a voltage at an interconnected node between the second transistor MOS2 and the third transistor MOS3 (i.e., a source of the third transistor MOS3) is approximately the same as the output voltage Vout because Vout (at the output node) minus threshold (or gate-to-source) voltage Vt of MOS1 plus threshold (or gate-to-source) voltage Vt of MOS3 is approximately equal to Vout (at the interconnected node). It is further noted that a ratio of an output current of the output driving transistor MOSO to a current through the second/third transistor MOS2/3 may be determined by a size ratio (e.g., m:1) of the output driving transistor MOSO to the second/third transistor MOS2/3. Therefore, the current through the second/third transistor MOS2/3 is I, the current through the output driving transistor MOSO is mI, and the current toward a load 10 is equal to mI minus a current of the current source (of the current circuit 11).

Specifically speaking, in the embodiment, the output driving transistor MOSO includes a P-type MOSFET, the first transistor MOS1 includes a P-type MOSFET, the second transistor MOS2 includes a P-type MOSFET, and the third transistor MOS3 includes a P-type MOSFET. The output driving transistor MOSO has a source connected to the power supply, and a drain connected to the output node. The first transistor MOS1 has a source connected to the output node, and a drain connected to the current circuit 11. The second transistor MOS2 has a source connected to a power supply, and a drain connected to a source of the third transistor MOS3. The third transistor MOS3 has a drain connected to the current measuring circuit 12.

Figure 1B:
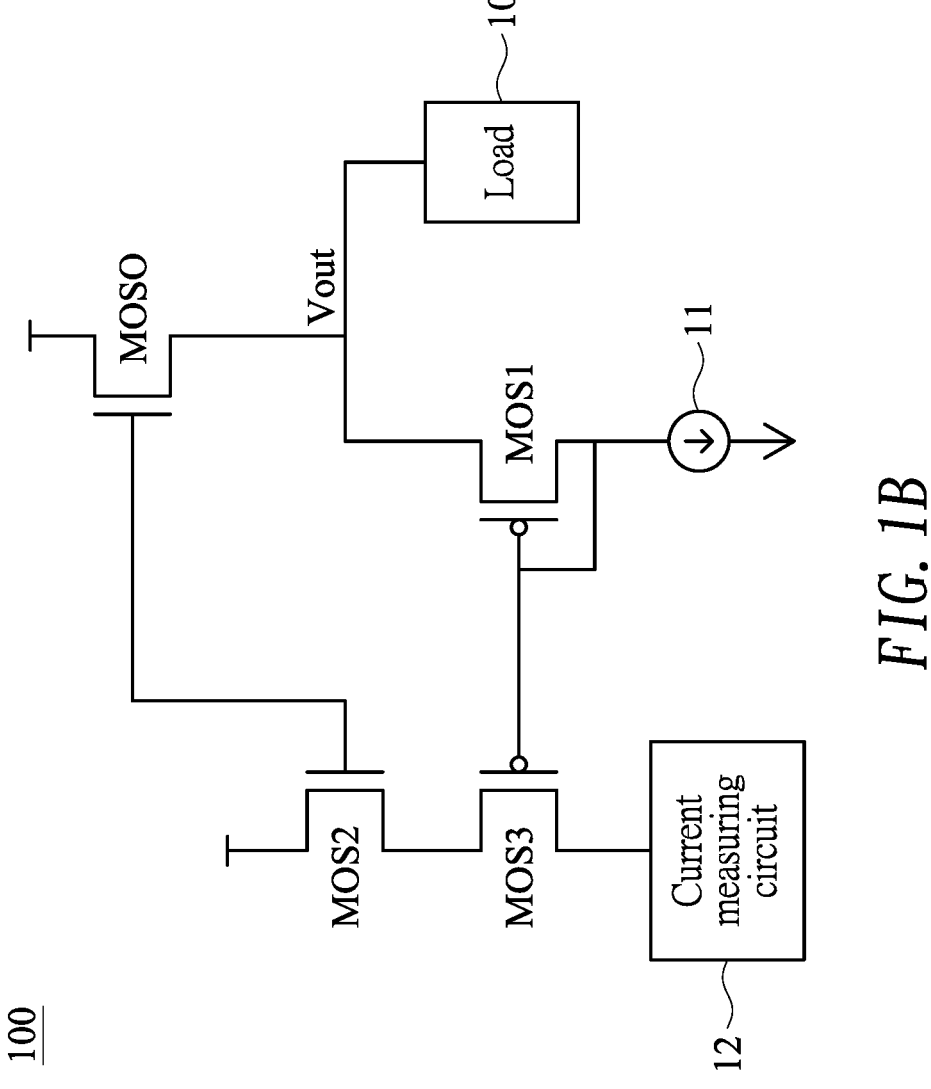
FIG. 1B shows a circuit diagram illustrating a current sensing circuit adaptable to MOSFET circuits according to another embodiment of the present invention.

FIG. 1B shows a circuit diagram illustrating a current sensing circuit 100 adaptable to MOSFET circuits according to another embodiment of the present invention. The current sensing circuit 100 of FIG. 1B is similar to the current sensing circuit 100 of FIG. 1A with the following exceptions.

Specifically speaking, in the embodiment, the output driving transistor MOSO includes an N-type MOSFET, the first transistor MOS1 includes a P-type MOSFET, the second transistor MOS2 includes an N-type MOSFET, and the third transistor MOS3 includes a P-type MOSFET. The output driving transistor MOSO has a drain connected to the power supply, and a source connected to the output node. The first transistor MOS1 has a source connected to the output node, and a drain connected to the current circuit 11. The second transistor MOS2 has a drain connected to the power supply, and a source connected to a source of the third transistor MOS3. The third transistor MOS3 has a drain connected to the current measuring circuit 12.

Figure 2:
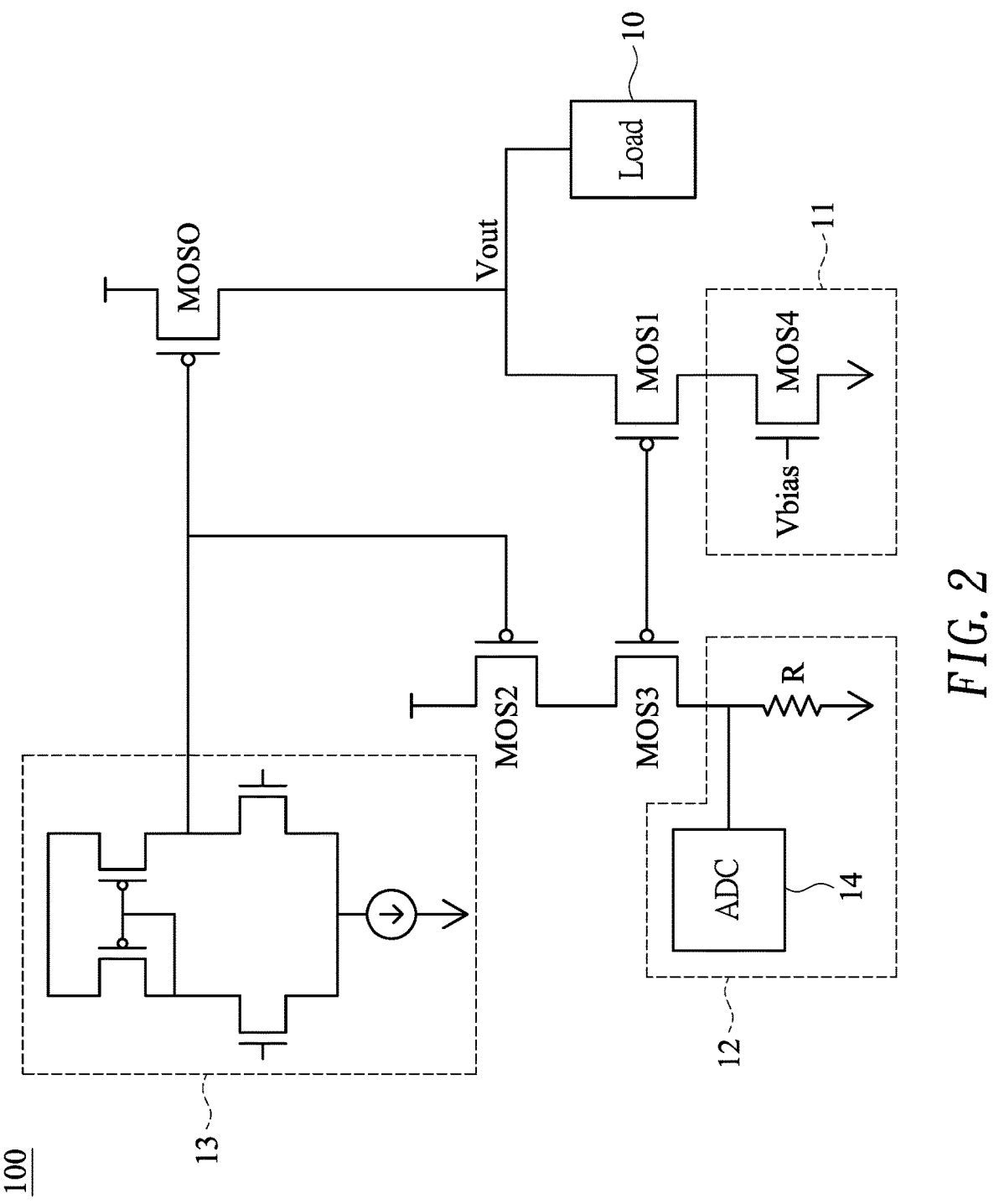
FIG. 2 shows a circuit diagram illustrating a current sensing circuit according to a first exemplary embodiment of the present invention.

FIG. 2 shows a circuit diagram illustrating a current sensing circuit 100 according to a first exemplary embodiment of the present invention. The current sensing circuit 100 of FIG. 2 adopts the basic circuit architecture of FIG. 1A with details described as follows.

Specifically, the current circuit 11 of the embodiment may include a fourth transistor MOS4. In the embodiment, the fourth transistor MOS4 includes an N-type MOSFET. The fourth transistor MOS4 has a drain connected to (the drain of) the first transistor MOS1, a source connected to the earth, and a gate coupled to receive a bias voltage Vbias. As exemplified in FIG. 2, an input stage circuit 13, for example, of an operational amplifier is shown.

In the embodiment, the current measuring circuit 12 may include a resistor R connected between (the drain of) the third transistor MOS3 and the earth, and an analog-to-digital converter (ADC) 14 configured to convert an (analog) voltage across the resistor R into a digital signal according to which a current flowing through the second transistor MOS2 and the third transistor MOS3 can be derived. Therefore, the current can be monitored in real time.

Figure 3:
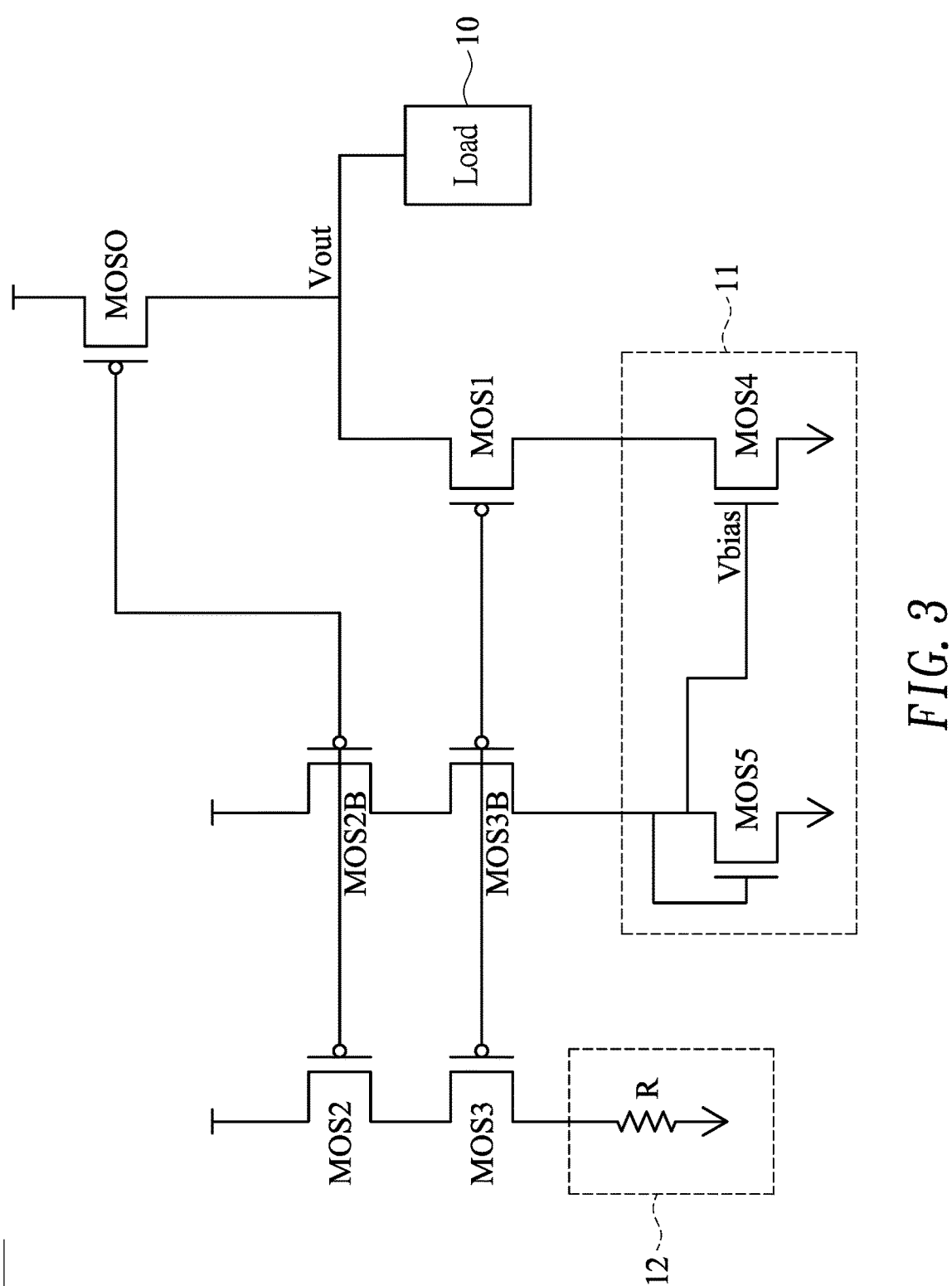
FIG. 3 shows a circuit diagram illustrating a current sensing circuit according to a second exemplary embodiment of the present invention.

FIG. 3 shows a circuit diagram illustrating a current sensing circuit 100 according to a second exemplary embodiment of the present invention. The current sensing circuit 100 of FIG. 3 adopts the basic circuit architecture of FIG. 1A with details described as follows.

In the embodiment, the current circuit 11 may include a replica second transistor MOS2B and a replica third transistor MOS3B connected in series between the power supply and the current circuit 11. The replica second transistor MOS2B and the replica third transistor MOS3B have gates coupled to the gates of the second transistor MOS2 and the third transistor MOS3 respectively. Specifically, the replica second transistor MOS2B includes a P-type MOSFET, and the replica third transistor MOS3B includes a P-type MOSFET. The replica second transistor MOS2B has a source connected to the power supply, and a drain connected to a source of the replica third transistor MOS3B. The replica third transistor MOS3B has a drain connected to the current circuit 11.

In the embodiment, the current circuit 11 may include a current mirror circuit that is composed of a fourth transistor MOS4 and a diode-connected (with gate and drain connected) fifth transistor MOS5. In the embodiment, the fourth transistor MOS4 includes an N-type MOSFET, and the fifth transistor MOS5 includes an N-type MOSFET. The fourth transistor MOS4 has a drain connected to (the drain of) the first transistor MOS1, a source connected to the earth, and a gate coupled to receive a bias voltage Vbias. The fifth transistor MOS5 includes a drain connected to the drain of the replica third transistor MOS3B and the gate of the fourth transistor MOS4, and a source connected to the earth.

In the embodiment, the current measuring circuit 12 may include a resistor R connected between (the drain of) the third transistor MOS3 and the earth. Therefore, a voltage across the resistor R may be used for subsequent measurements. It is noted that a ratio of an output current of the output driving transistor MOSO to a current flowing through the second/third transistor MOS2/3 will not substantially change due to either light load or heavy load by setting size ratio among the output driving transistor MOSO, the fourth/fifth transistor MOS4/5 and the second/third transistor MOS2/3.

In one example, a ratio of an output current of the output driving transistor MOSO to a current through the second/third transistor MOS2/3 may be determined by a size ratio (e.g., m:1) of the output driving transistor MOSO to the first/second/third/replica second/replica third transistor MOS1/2/3/2B/3B and the fourth/fifth transistor MOS4/5. Therefore, the current through the second/third/replica second/replica third transistor MOS2/3/2B/3B is I, the current through the output driving transistor MOSO is mI, and the current toward a load 10 is equal to (m−1)I.

In a further example, a size ratio of the fifth transistor MOS5 to the fourth transistor MOS4 is n:1 (instead of 1:1 as in the previous example), and the current toward the load 10 is equal to (m−1/n)I.

Figure 4:
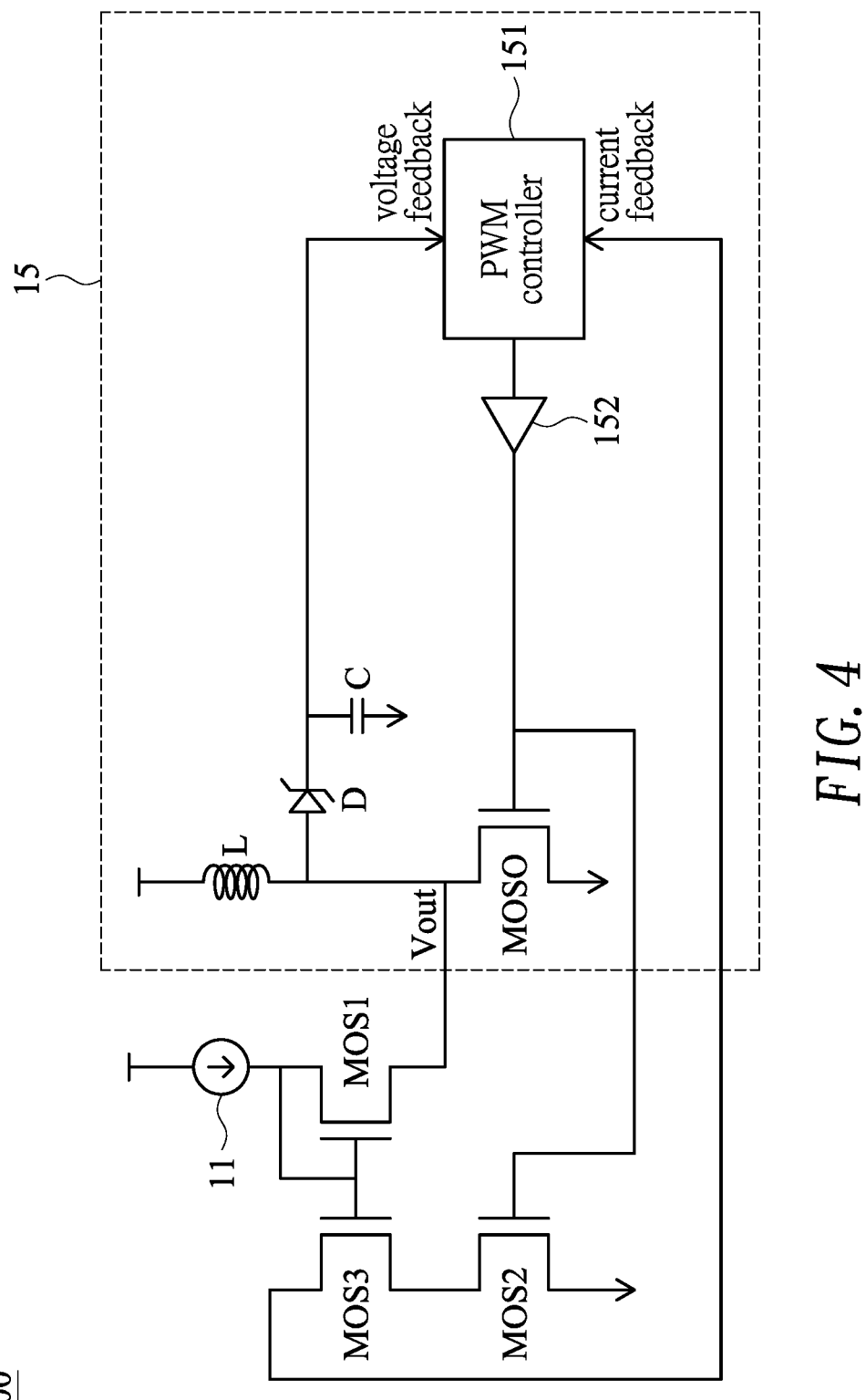
FIG. 4 shows a circuit diagram illustrating a current sensing circuit according to a third exemplary embodiment of the present invention.

FIG. 4 shows a circuit diagram illustrating a current sensing circuit 100 according to a third exemplary embodiment of the present invention. The current sensing circuit 100 of FIG. 4 adopts the basic circuit architecture of FIG. 1B but replacing the first transistor MOS1 and the third transistor MOS3 with N-type MOSFETs.

The current sensing circuit 100 of the embodiment may include a DC-to-DC converter 15 coupled to the first transistor MOS1, the second transistor MOS2 and the third transistor MOS3. Specifically, the DC-to-DC converter 15 may include an inductor L and the output driving transistor MOSO connected in series between the power supply and the earth, with an interconnected node therebetween connected to a drain of the first transistor MOS1. The output driving transistor MOSO has a gate connected to a gate of the second transistor MOS2. The DC-to-DC converter 15 may include a Zener diode D with an anode connected to the interconnected node (between the inductor L and the output driving transistor MOSO), and at least one capacitor C connected between a cathode of the Zener diode D and the earth. The DC-to-DC converter 15 may include a pulse-width modulation (PWM) controller 151 (acting as the current measuring circuit 12) configured to generate a control signal provided to (a gate of) the output driving transistor MOSO, for example, via an amplifier 152. The PWM controller 151 operates under voltage feedback from the cathode of the Zener diode D and current feedback from (a source of) the third transistor MOS3. Therefore, current feedback control can be achieved. It is noted that a ratio of a current through the output driving transistor MOSO to a current through the third/second transistor MOS3/2 may be determined by a size ratio (e.g., m:1) of the output driving transistor MOSO to the third/second transistor MOS3/2.

Although specific embodiments have been illustrated and described, it will be appreciated by those skilled in the art that various modifications may be made without departing from the scope of the present invention, which is intended to be limited solely by the appended claims.

What is claimed is:

1. A current sensing circuit adaptable to metal-oxide-semiconductor field-effect transistor (MOSFET) circuits, comprising:

an output driving transistor with an output node that provides an output voltage;

a diode-connected first transistor connected between the output node and a current circuit, the diode-connected first transistor having a gate and a drain tied together;

a second transistor and a third transistor connected in series, the second transistor having a gate connected to a gate of the output driving transistor, and the third transistor having a gate connected to a gate of the first transistor; and a current measuring circuit connected in series with the second transistor and the third transistor to measure a current flowing through the second transistor and the third transistor.

2. The current sensing circuit of claim 1, wherein the current circuit comprises a current source.

3. The current sensing circuit of claim 1, wherein the output driving transistor comprises a P-type MOSFET, the first transistor comprises a P-type MOSFET, the second transistor comprises a P-type MOSFET, and the third transistor comprises a P-type MOSFET.

4. The current sensing circuit of claim 3, wherein the output driving transistor has a source connected to a power supply, and a drain connected to the output node; the first transistor has a source connected to the output node, and a drain connected to the current circuit; the second transistor has a source connected to the power supply, and a drain connected to a source of the third transistor; and the third transistor has a drain connected to the current measuring circuit.

5. The current sensing circuit of claim 1, wherein the output driving transistor comprises an N-type MOSFET, the first transistor comprises a P-type MOSFET, the second transistor comprises an N-type MOSFET, and the third transistor comprises a P-type MOSFET.

6. The current sensing circuit of claim 5, wherein the output driving transistor has a drain connected to a power supply, and a source connected to the output node; the first transistor has a source connected to the output node, and a drain connected to the current circuit; the second transistor has a drain connected to the power supply, and a source connected to a source of the third transistor; and the third transistor has a drain connected to the current measuring circuit.

7. The current sensing circuit of claim 4, wherein the current circuit comprises a fourth transistor.

8. The current sensing circuit of claim 7, wherein the fourth transistor comprises an N-type MOSFET having a drain connected to the drain of the first transistor, a source connected to earth, and a gate coupled to receive a bias voltage.

9. The current sensing circuit of claim 4, wherein the current measuring circuit comprises a resistor connected between the drain of the third transistor and earth, and an analog-to-digital converter (ADC) that converts a voltage across the resistor into a digital signal according to which a current flowing through the second transistor and the third transistor is derived.

10. The current sensing circuit of claim 7, further comprising: a replica second transistor and a replica third transistor connected in series between the power supply and the current circuit, the replica second transistor and the replica third transistor having gates coupled to the gates of the second transistor and the third transistor respectively.

11. The current sensing circuit of claim 10, wherein the replica second transistor comprises a P-type MOSFET, and the replica third transistor comprises a P-type MOSFET, the replica second transistor having a source connected to the power supply, and a drain connected to a source of the replica third transistor, the replica third transistor having a drain connected to the current circuit.

12. The current sensing circuit of claim 11, wherein the current circuit comprises a current mirror circuit that is composed of the fourth transistor and a diode-connected fifth transistor.

13. The current sensing circuit of claim 12, wherein the fourth transistor comprises an N-type MOSFET, and the fifth transistor comprises an N-type MOSFET, the fourth transistor having a drain connected to the drain of the first transistor, a source connected to earth, and a gate coupled to receive a bias voltage, the fifth transistor having a drain connected to the drain of the replica third transistor and the gate of the fourth transistor, and a source connected to the earth.

14. The current sensing circuit of claim 10, wherein the current measuring circuit comprises a resistor connected between the drain of the third transistor and earth.

15. The current sensing circuit of claim 1, wherein the output driving transistor comprises an N-type MOSFET, the first transistor comprises an N-type MOSFET, the second transistor comprises an N-type MOSFET, and the third transistor comprises an N-type MOSFET.

16. The current sensing circuit of claim 15, further comprising a direct-current (DC)-to-DC converter coupled to the first transistor, the second transistor and the third transistor.

17. The current sensing circuit of claim 16, wherein the DC-to-DC converter comprises:

an inductor, connected in series with the output driving transistor between a power supply and earth, with an interconnected node therebetween connected to a drain of the first transistor, the output driving transistor having a gate connected to a gate of the second transistor;

a Zener diode with an anode connected to the interconnected node;

at least one capacitor connected between a cathode of the Zener diode and the earth; and a pulse-width modulation (PWM) controller acting as the current measuring circuit to generate a control signal provided to the gate of the output driving transistor;

wherein the PWM controller operates under voltage feedback from the cathode of the Zener diode and current feedback from a source of the third transistor.

\* \* \* \* \*